United States Patent [19]

Hall

[11] Patent Number: 4,560,100

[45] Date of Patent: Dec. 24, 1985

[54] AUTOMATED SOLDERING PROCESS AND APPARATUS

[75] Inventor: Richard L. Hall, West Friendship, Md.

[73] Assignee: Westinghouse Electric Corp., Pittsburgh, Pa.

[21] Appl. No.: 662,648

[22] Filed: Oct. 19, 1984

[51] Int. Cl.⁴ .............................................. B23K 1/08
[52] U.S. Cl. ................................ 228/40; 228/56.1; 228/180.1; 219/85 BA; 219/121 LC
[58] Field of Search ................ 228/36, 40, 179, 56.1, 228/56.2, 180.1, 180.2; 219/85 BA, 85 BM, 85 CA, 85 CM, 85 D, 85 E, 85 G, 85 M, 121 EC, 121 CD, 121 EF, 121 EG, 121 LC, 121 LD, 121 LE, 121 LF

[56] References Cited
U.S. PATENT DOCUMENTS
4,390,120  6/1983  Broyer ................................. 228/180.1

*Primary Examiner*—Kuang Y. Lin
*Attorney, Agent, or Firm*—H. W. Patterson

[57] ABSTRACT

An automated discreet soldering system for plated holes of a printed wiring board, having a free piston type crucible mode of graphitic material, which is propelled along a guided path by pressurized nitrogen. A laser beam is directed along a path substantially coincident with the path of travel of the crucible to heat a susceptor surface for melting the solder therein.

14 Claims, 14 Drawing Figures

4,560,100

AUTOMATED SOLDERING PROCESS AND APPARATUS

BACKGROUND OF THE INVENTION

1. Field of the Invention

The present invention relates to automated soldering, and more particularly, to an improved method and apparatus for making soldered joints for assemblages of electronic components.

2. Description of the Prior Art

Methods of making soldered joints in devices where many electronic components are electrically joined to an interconnecting pattern on a common base of insulated material, such as printed wiring boards (PWB), may be classified as either discrete joint soldering, where each joint is soldered individually by a soldering iron, or batch soldering such as wave soldering, where the PWB with its full complement of components in position, is subjected to a molten wave of solder. Heretofore, because of its relative speed, wave soldering was widely utilized, particularly where a large number of soldered joints were required on a single PWB. However, there are certain disadvantages in wave soldering, for example, the individual components are usually mechanically fastened to the PWB in some manner, prior to being subjected to the molten wave of solder; the time-of-exposure to the molten solder must be long enough to heat the greatest thermal sink locality on the PWB, resulting in unnecessary thermal stressing of all other areas of the PWB and its associated components; and the exposure of the PWB to high temperatures requires special treatment to prevent moisture outgassing and associated delamination of the epoxy glass board material. Additionally, wave soldering may result in many defective or non-uniform joints. Therefore, in order to measure the actual efficiency of the wave-soldering method, consideration must be given to the time and effort required to mechanically fasten the components in position, the wave-soldering process itself, and the detection and repair of defective soldered joints. The main categories of defective joints made by wave soldering are: insufficient or excess solder, voids, no solder, or pinholes in the joint, and solder bridging between circuits, and to a lesser extent lifted solder pads. Discrete joint soldering, of course, is beneficial in that it permits optimization of the process parameters required for each joint on the PWB, resulting in high quality joints with minimum defects. However, to enable discrete joint soldering to be economically feasible when compared to wave soldering, certain problems must be overcome; particularly where the thermal energy required to heat the joint is conducted through the soldering tip or probe, such as a soldering iron. For example, the cross-section of the probe should be preferably approximately the same size as the diameter of the solder pad in order to restrict the heat applied exclusively to the target joint (typically 0.050″) diameter. This small size imposes practical limits on the rate at which the thermal energy can be transferred to the joint by conduction. This in turn, particularly for joints with large heat sinks (i.e. buss planes), creates a significant time lag when the thermal energy stored in an idle probe is initially drawn into the joint at a higher rate than can be resupplied from a remote power (heat) source. This time/temperature relationship results in uncontrolled and unnecessary heating of the surrounding board laminate and the associated component. Further, for discrete-joint soldering, the probe material should on the one hand be a good thermal conductor such as most metals, and on the other hand not corrode or degrade in any way that would have an adverse effect on conduction of heat into the joint. Maintenance of a constant, and therefore predictable, conductance factor, appears to be a requisite for an automated, discrete joint soldering process.

In an attempt to overcome the disadvantages of discrete-joint soldering when performed with a soldering iron, it has been proposed to utilize a laser beam as the energy source for surface-mounted components, where the solder must be applied to the same side of the PWB as the components are mounted. However, as far as is known, a method and apparatus for making discretely soldered joints in through-hole PWB's automatically, and thereby overcoming the disadvantages of wave soldering, has not been known prior to the present invention.

SUMMARY OF THE INVENTION

In accordance with the present invention, there is provided an improved method and apparatus for making discretely soldered joints in plated holes of a printed wiring board. Such a system includes a crucible in which metered solder is deposited, melted, carried, and applied, which crucible is slidably mounted in a vertically extending cylinder to function as a guided free piston. The piston carried crucible is propelled freely to its soldering position along a vertical axis normal to the plane of the PWB and parallel to the travel of the energy beam for melting the solder.

In another aspect, the system and method provide for improving the shearing, carrying, and depositing in the crucible a precisely metered length of solder.

Also, the present invention includes a crucible structure that optimizes the precise control of the conversion of light energy to thermal energy, which in turn maximizes conformity of the soldered joints. In one specific aspect, the suscepting surface of the crucible is a graphite material, that is of greater cross sectional area than the crucible.

GENERAL DISCUSSION OF THE PREFERRED EMBODIMENT

Figure 1:
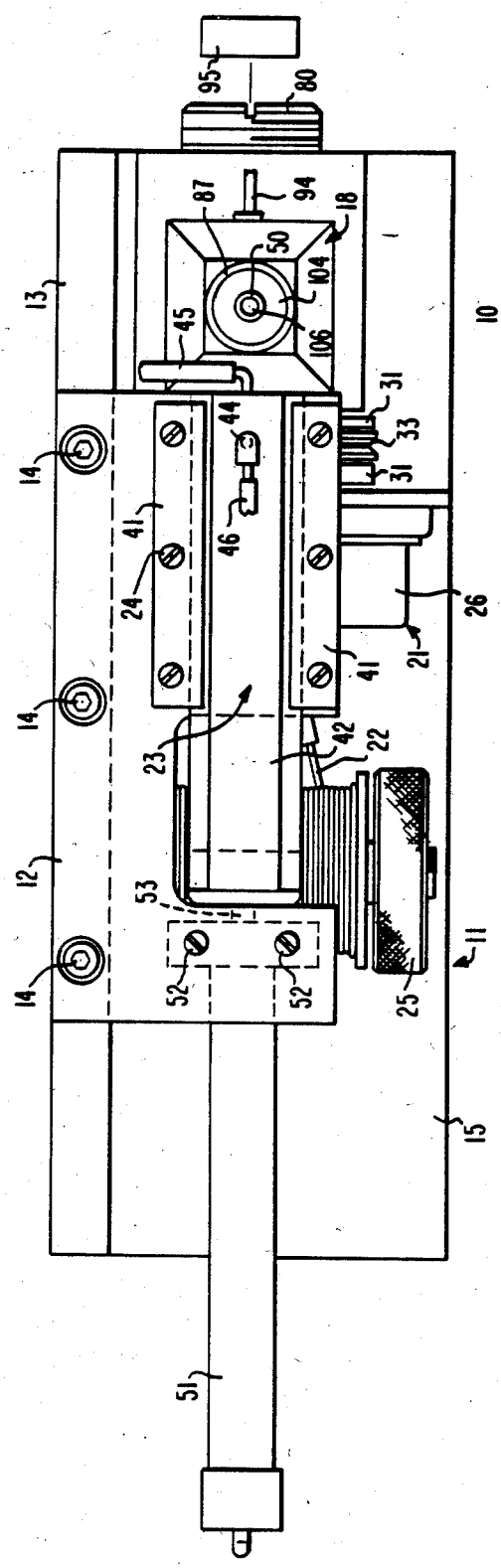
FIG. 1 is a plan view of the apparatus according to one embodiment of the present invention.
Figure 2:
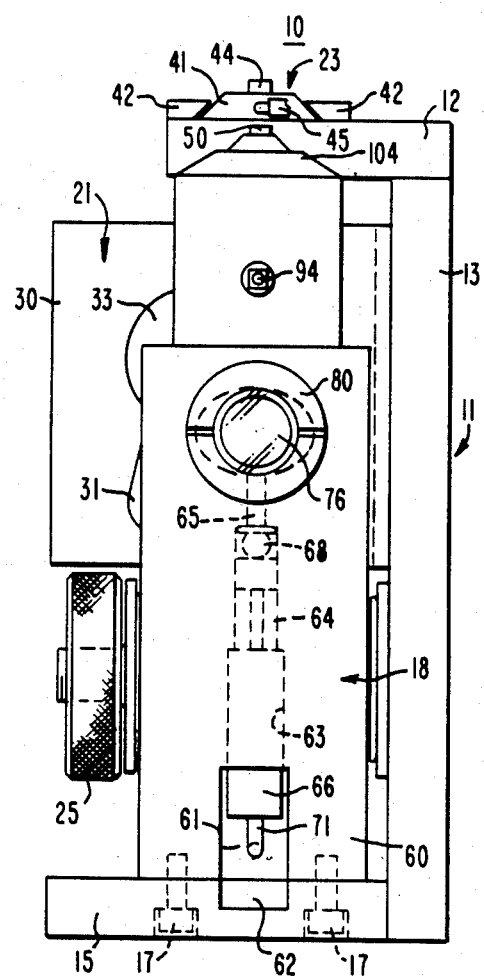
FIG. 2 is a front elevation of the apparatus of FIG. 1.

The method and system of the present invention, which is adapted to be used in a robotic printed wiring board (PWB) assembly and test station, involves a controlled, discrete-joint, soldering process where the solder process variables are precisely controlled to provide uniform, minimum-defect, soldered joints. In carrying out the process, a computer-controlled apparatus is utilized that feeds the solder, preferably with the flux in its hollow core, and severs a predetermined length (volume) of such solder. The metered solder is supported while being transported by slight air pressure introduced radially in a bore containing the solder slug and deposited in the crucible with aid of slight air pressure introduced above the slug carrying bore.

The crucible is carried upward by a free piston, toward the underside of a PWB plated through-hole from which a short length of component lead wire may protrude. The lead wire, the plated through-hole, and the solder filler metal constitutes the soldered joint. The bottom of the crucible that carries the metered solder piece is a susceptor that converts light energy focused on it to thermal energy to heat the solder to a molten state for application to the joint. In turn, the molten solder comes into contact with the protruding wire and the plated hole to heat the wire and the through-hole plating, such that the molten solder is drawn from the crucible into the hole. Once the solder is in place, the crucible and the PWB are repositioned relative to one another for soldering another joint.

The thermal energy which is created preferably by laser beam, particularly for applications where ambient heat must be avoided, is applied to a suscepting surface of a crucible which conducts the heat to the solder in the crucible, and then from the solder to the component lead wire and the plated hole to form the joint. Thermal energy, such as infrared radiation, also may be applied directly to the area surrounding the plated hole for localized preheating, to provide a more rapid soldering of each joint.

The susceptor base of the crucible to which the thermal energy beam is applied has a surface area substantially larger than the area of the crucible to permit greater responsiveness to beam power changes, and faster temperature rise times by distributing the laser beam power over a larger area. The crucible is connected at its base to a cylindrical piston-like member slidably mounted in a vertical cylinder. The crucible and the cylindrical member form a free piston that is propelled under fluid pressure to the soldering position. The use of the free piston ensures the proper positioning of the molten solder for the discrete formation of each soldered joint.

In the method and apparatus illustrated, solder is metered and heated for one joint at a time. The source of thermal energy is programmed to provide temperature control during the repetitive process of metering, melting, and applying the solder. In one application of the present invention, the laser beam parameters are controlled by computer software to provide the power, pulse length, or continuous beam required for the particular application. The axis of the energy beam is substantially coincident with the axis of travel of the piston. The crucible may be preferably of any suitable graphitic material which has a relatively rapid rate of heat transfer and is a good suscepting material for infrared energy. When a laser for infrared beam such as is created by a $CO^2$ laser is utilized, it has been determined that graphite or silicon-carbide is particularly desirable in that it does not react with solder or flux, is non-wetting, and does not oxidize below 750° F. It also has the high thermal conductivity necessary to provide uniformity in the soldered joints.

DESCRIPTION OF THE PREFERRED EMBODIMENT

Referring to FIGS. 1 through 4, a soldering apparatus 10 is comprised of a generally C-shaped supporting frame 11 of rectangular cross-section having an upper or top portion 12, fastened to a back or vertical portion 13, by screws 14. The back portion 13 in turn is fastened to a base portion 15 by screws such as 16. The base 15 may be supported or fastened to a work surface (not shown) to stand upright as viewed in the drawings.

Figure 3:
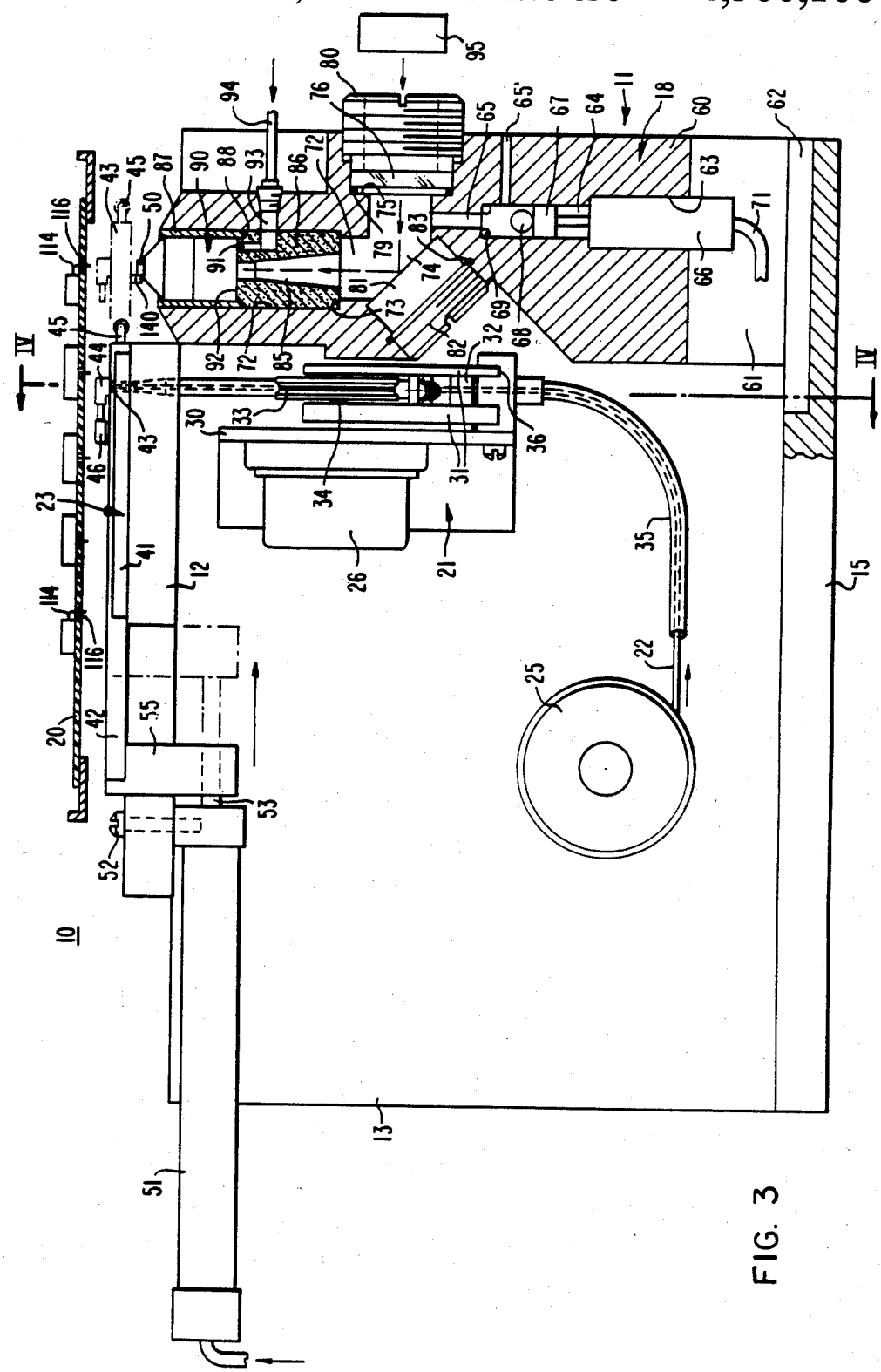
FIG. 3 is a side elevation of the apparatus of FIGS. 1 and 2, partially in section and showing schematically a PWB in soldering position.

Secured to the base portion 15 adjacent one end thereof by screws 17 is a solder applying assembly 18 that melts, carries and applies metered solder to the underside of a PWB 20 (see FIG. 3). Fastened to the back portion 13 of the frame 11 is a solder feeding assembly 21, that feeds flux-core solder wire 22 to a shearing and carrying mechanism 23 fastened to the upper frame portion 12 by screws 24. The solder 22 is fed from a spool such as 25 rotatably fastened to the back frame portion 13.

The solder feeding assembly 21 is comprised of a stepper motor 26 that drives a serrated edge pulley 27 through a shaft 28. The motor 26 is supported by a plate 30 through which its shaft 28 (FIG. 4) extends. A pair of spaced arms 31 are pivotally attached at one end to the plate 30 by a pin 32; the other end of the arms 31 rotatably support therebetween an idler pulley 33 on a shaft 34. The solder 22 on the spool 25 is guided through a tube that extends through a member 36 attached to the plate 30 and then between the pulleys 27 and 33. The arms 31 are urged pivotally about the pin 32 by a spring 37 such that the pulley 33 engages the solder at the periphery of the pulley 27. The solder 22 fits in the groove of the pulley 33 and is gripped by serrations on the periphery of the pulley 27 to be fed as governed by the stepping motor 26. The solder 22 is guided through a second tube 38 and fed through a bore 40 in the upper frame member 12 to be engaged by a shear 41 of the assembly 23.

The shearing assembly 23 is comprised of the shear 41 which is slidably mounted between spaced guides 42 in contact with the upper surface of the member 12. The solder slug is advanced from the bore 40 into bore 43. Above bore 43 in the shear is a cover member 44 that prevents the metered solder from leaving the bore 43 during a first portion of its travel.

After the solder piece is sheared, a slight gas pressure is created in the bore 43 of the member 41 via tube 45 to cause the solder piece to levitate in the bore while being positioned in registry with crucible 50. Also, slight gas pressure is created above the solder piece in the bore 43 via tube 46 to help dislodge the solder from the bore 43 when it is in registry with the crucible 50. A hydraulic or pneumatic cylinder 51 is fastened to the upper frame portion 12 by screws 52; and has a piston rod 53 connected to the slidable shear member 41 through a connecting member 55 to move the shearing member 41 into and out of shearing position.

The solder melting and applying assembly 18 is comprised of a metallic piece 60 which may be substantially rectangular in configuration. The lower portion of the piece 60 which is fastened to the base member 15 of the frame 11 by the screws 17 (see FIG. 2) has a slot 61 that mates with a slot 62 in the base 15 to form a rectangular opening, the axis of which is parallel to the base member (see FIG. 3). Communicating with the slot 61 at its top wall is a bore 63, an intermediate portion 64 of lesser diameter and an upper portion 65 of least diameter. The lower portion 63 of the bore houses an hydraulic or pneumatic cylinder 66 having a piston carried member 67 that engages a ball 68 to sealingly close and open the lower end of the upper portion 65 of the bore. The ball 68 is forced by the member 67 to engage an O-ring 69 to seal the upper portion 65. The bore comprised of the portion 63, 64 and 65 is preferably circular in cross-section. The cylinder 66 extends into the slot 61 to accommodate a tube 71 for introducing fluid to apply pressure to operate the ball valve 68.

Formed in the upper portion of the piece 60 is a cylindrical bore 72 having a portion of reduced diameter to form a shoulder 73. The upper portion of the bore 72 communicates with the exterior surface of the piece 60, and has a vertical axis that extends substantially normal to the path of the shear member 42. The lower end of the bore 72 communicates with a cylindrical opening 74 having an axis that extends normal to the axis of the opening 72. The opening 74 has a shoulder 75 to support a lens such as 76 that seals the opening by an O-ring 79. The outer end of the opening 74 is threaded to receive a threaded annular ring or plug 80 for securing the lens 76 in position. The piece 60 also has an opening the axis of which intersects the opening 72 and the opening 74 at an angle of 45° to the axis of the opening 72 and the opening 74. A deflecting mirror 81 fits at the juncture of 72 and 74 and is sealed therein by a threaded plug 82 that engages an O-ring 83. The face of the mirror 81 is at such an angle that a beam of energy entering the opening 74 through the lens 76 is deflected to be coincident with the axis of the opening 72 and then go through a tapered bore 85 of a sleeve 86 that fits in the opening 72. The lower end of the sleeve 86 rests against the shoulder 73. The upper end of the opening 72 has a liner 87 having a lower edge that fits in an annular groove 88 at the upper end of the sleeve 86.

A cylindrical piston 90 preferably made of graphite slidably fits in the liner 87 in the upper end of the cylindrical opening 72. The sleeve 86 has a port 91 that communicates at one end with the upper surface 92 of the sleeve 88 and is offset and radially spaced from the axis of the central opening 85 of the sleeve 86. The port 91 is open at its other end with the peripheral surface of the sleeve 86 and an opening 93 in the metallic piece 60 for introducing fluid pressure beneath the piston 90 by way of a tube 94 for lifting the crucible 50 to its respective operating positions as described hereinafter.

Figure 5:
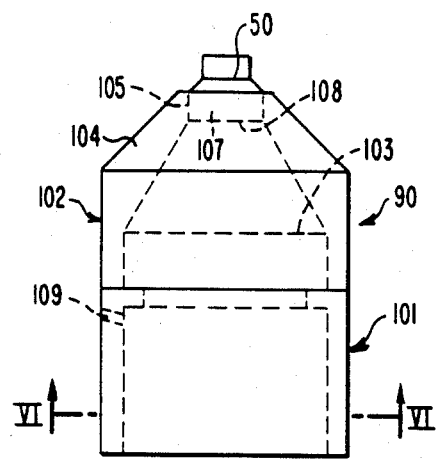
FIG. 5 is an enlarged view in elevation of the crucible and piston according to one embodiment of the present invention.
Figure 6:
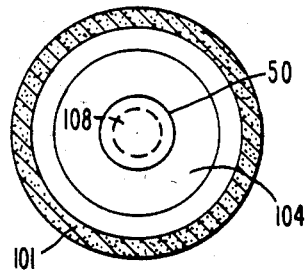
FIG. 6 is an enlarged plan view of the crucible and piston looking in the direction of arrows on line VI—VI in FIG. 5.

Referring to FIGS. 5, 6 and 7, the piston 90 is substantially hollow and is comprised of a lower tubular skirt portion 101, preferably made of graphite, an intermediate portion 102 bonded to the skirt 101 and has a central opening 105 that is cylindrical throughout a portion of its length and is frustoconical at its upper portion 104. The upper smaller diameter portion of the opening 105 of the member 102 is threaded to receive the crucible 50 which forms the upper portion of the piston 90. The crucible 50 includes a chamber 106 that is of a depth and diameter to contain a sufficient quantity of solder for a single joint. The chamber 106 is slightly tapered internally, which aids in causing the molten solder sphere to assume a position towards the top of the chamber. The depth of the crucible chamber 61 is also sufficient to receive a typical protruding lead wire of the mounted component that may vary in length. The crucible 50 has a threaded base portion 107 with a diameter substantially greater than the exterior diameter of the crucible chamber 106. The enlarged area of the base 107 includes the susceptor surface 108 to which the laser energy beam is applied.

The intermediate portion 102 of the cylinder 90 is a thermal insulator. One type that proved to be operable is a glass ceramic, which is machinable and widely known by the trade name MACOR manufactured by the Corning Glass Company of Corning, N.Y. The crucible 50 and the skirt portion 101 are preferably made of graphite. The portion 102 acts as a transition piece that is mechanically attached to the skirt 101 and the crucible 50 for the thermal isolation of the crucible 50. The thermal expansion coefficients of the glass and graphite appear to be well matched, at least in isothermal expansion, such that the diametrical clearance between the sleeve 87, which is preferably pyrex, and the graphite skirt 101 is maintained over wide operating temperatures. The graphite skirt 101 has a passage 109 for venting nitrogen gas to release the pressure beneath the crucible 50 and prevent the piston 90 from being propelled beyond a predetermined limit, if unrestrained by a printed wiring board in soldering position.

Figure 7A:
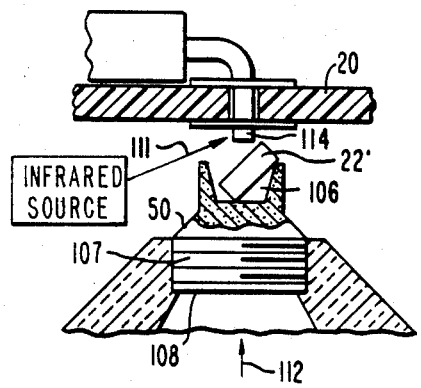
FIGS. 7A, 7B, 7C and 7D are enlarged fragmentary view of a crucible holding the solder at various positions during the making of a soldered joint according to the present invention, and also indicates the application of laser and infrared energy according to the present invention.
Figure 7B:
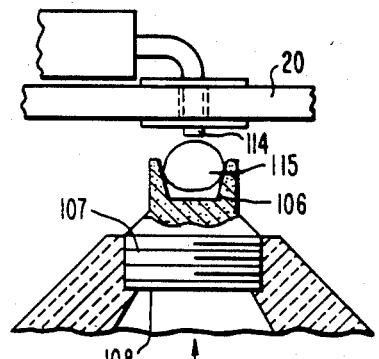
Figure 7C:
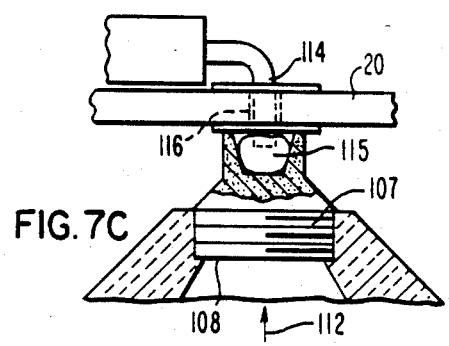
Figure 7D:
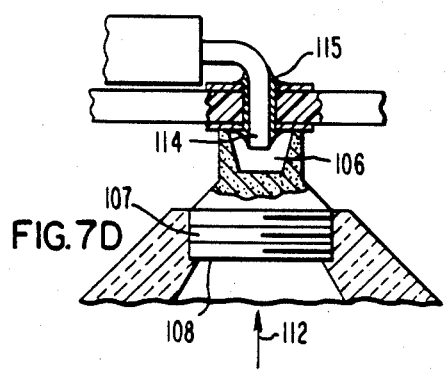

Referring to FIGS. 7A through 7D, the actual application of the solder is illustrated. In FIG. 7A, solder slug 22' is deposited in the crucible chamber 106, and if desired, the underside of the PWB board may be preheated by infrared energy as illustrated by the arrow 111, while the crucible 50 advances toward the PWB 20 as shown in FIG. 7B. The energy illustrated by a laser beam 112 is applied to the underside of susceptor surface 108 of the crucible 50, causing the solder to form a molten sphere 115 in the chamber 106, as shown in FIG. 7C. As the piston 90 is raised further, the protruding component wire 114 of the PWB 20 is immersed in the molten solder sphere 115. This immersion causes a heat transfer from the molten solder 115 to the wire 114 and the metallic plating and pads of through-hole 116. Once the wire 114 and the plated through-hole 116 have reached the proper temperature, the ball of solder 115 is then drawn between the protruding wire 114 and the plated hole 116, as shown in FIG. 7D, to form the solenoid joint. In actual practice, the solder 115 travels through plated hole 116 of the PWB forming a frustoconical solder shape at the top of the PWB, and a similar frustoconical shape at its bottom or underside. Once the joint is complete, the crucible 50 is withdrawn and travels downwardly in the reverse direction from that previously described until it reaches the starting position as shown in FIG. 7A. The laser is then turned off and a programmed wait time is entered to permit the solder fillet to solidify (see FIG. 7D).

As previously mentioned, an infrared beam 111 may be applied to the underside of the PWB board 20 at each joint just before the soldering cycle to minimize the soldering cycle time. In actual operation the entire soldering cycle from cutting and feeding the solder for one joint to the cutting and feeding of the solder for the next joint consumes aproximately four seconds. The utilization of the auxiliary infrared beam 111 shortens each cycle by approximately one-and-one-half seconds.

Figure 4:
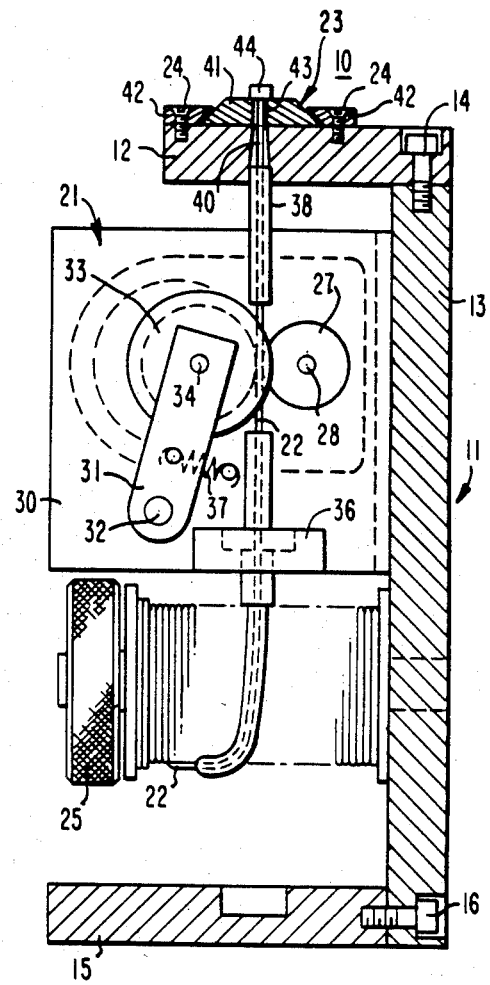
FIG. 4 is a sectional view taken on line IV—IV of FIG. 3 and looking in the direction of the arrows.
Figure 8A:
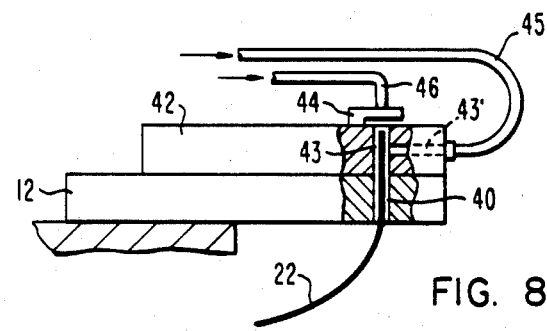
FIGS. 8A, 8B and 8C illustrate the operation of the shear and the transporting of the solder according to one embodiment of the invention.
Figure 8B:
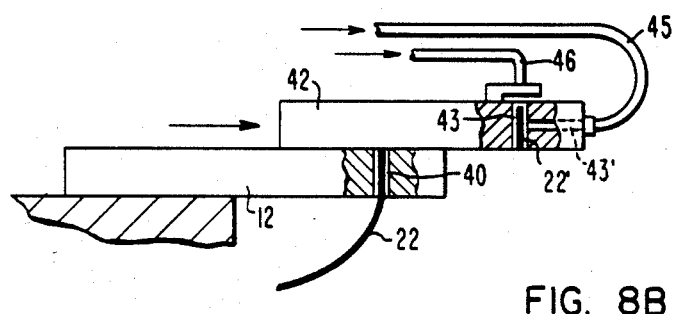
Figure 8C:
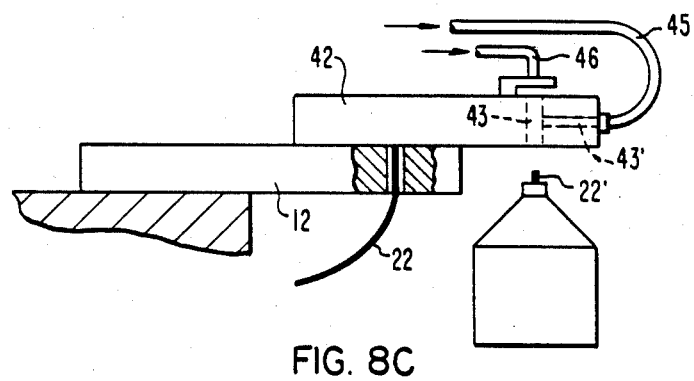
Figure 9:
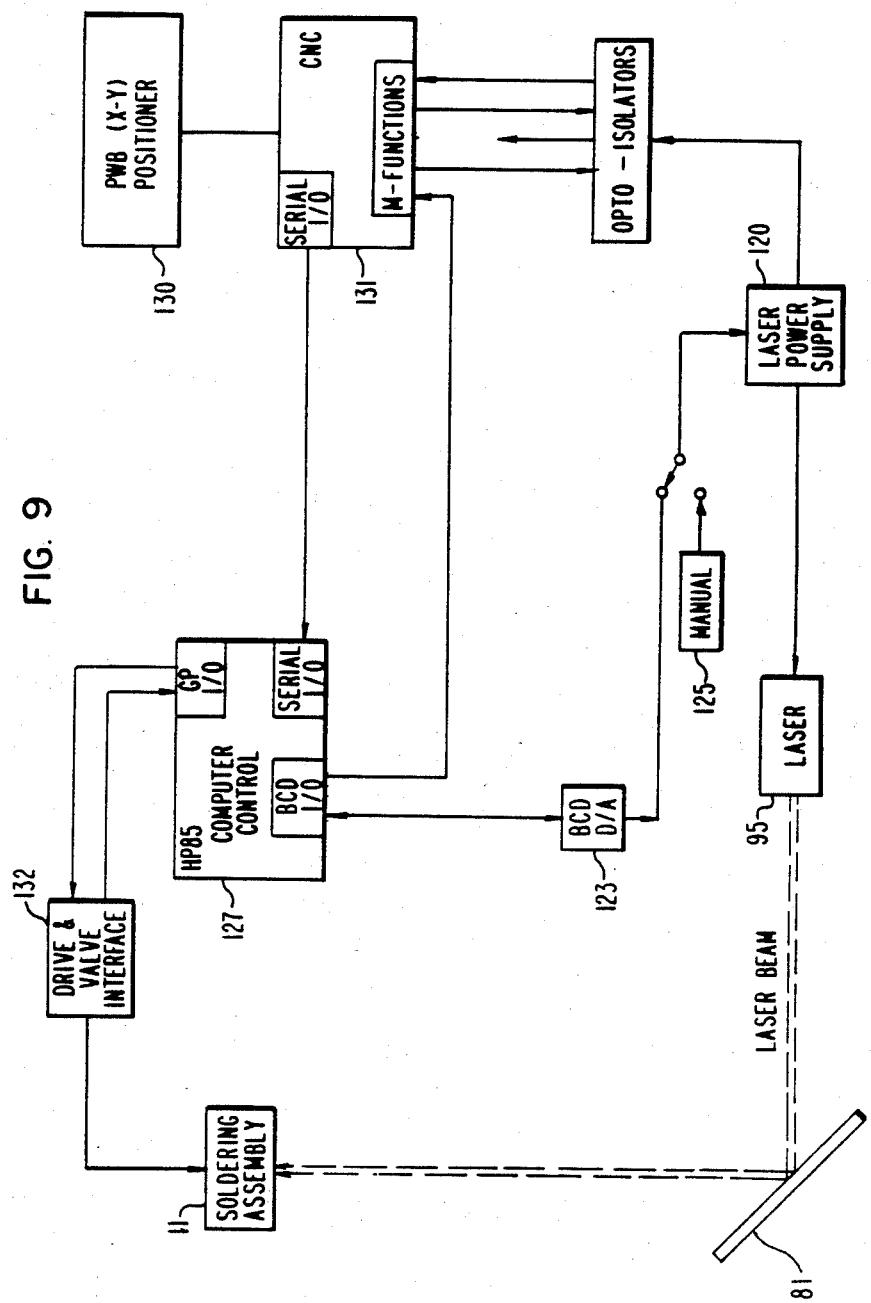
FIG. 9 is a schematic block diagram illustrating the control arrangement of an automatic discrete soldering method and system in accordance with the present invention.

A more detailed understanding of the invention may be had by describing the operation of the device in connection with FIGS. 8 and 9 in addition to the previously described Figures. In FIG. 4 the flux core solder 22 on the spool 25 is advanced between gear 27 and pressure wheel 33 to cause a precise amount of solder to extend beyond the top of the member 12 into the hole 43 to be cut by the shearing member 42, which is operated by the double acting hydraulic or pneumatic actuator 51. In the retracted position as shown in FIG. 8A the piston rod 53 is in its extreme left-hand position as viewed in FIG. 3, and the shear hole 43 is aligned concentrically with the feed hole 40. Initially, according to one actual embodiment, the stepper motor 26 drives the solder into bore 43 0.003" for each of a programmed number of activating pulses and then stops. Then the shearing member 42 shears the solder 22' from 22 and moves it in the shear hole 43 (see FIG. 8B) across the upper member 12 in one mechanical motion to a point centered over the crucible chamber 106 of the crucible 50 as shown in FIG. 8C. To hold the solder 22' in the shear hole 43 until it has come to a full stop and is aligned with the crucible 50, a jet of low pressure air flows into the shear hole 43 through a radial inlet 43' located in the sidewall of the shear hole, and to which is attached a small flexible hose connected to an air supply by way of a tube (FIG. 8B).

When the shear 42 cuts off the piece of solder, the piece of solder 22' is retained in the hole 43 by the slight positive pressure of the air. The air stream is directed upwardly and downwardly in the shearing hole, and the presence of the slug 22' in the hole 43 acts to modify or throttle the opposed streams. Applying Bernoulli's law relating to the energy relationship between internal fluid pressure and stream velocity, opposed forces develop on each end of the solder 22' in inverse proportion to the air stream velocity. When the slug 22' is centered on the jet of air entering through inlet 43', the two opposing air streams are equal, and the forces on the slug cancel. Due to the force of gravity acting on the slug 22' it, of course, tends to fall out of the hole 43. However, as the slug moves downwardly, the throttle action of the slug causes imbalance in the air streams with a greater proportion flowing upwardly. A point of equilibrium is reached where the pressure/force differential exerted upwards on the slug nulls the downward force of gravity and the slug levitates in the hole 43. Initially, or before hole 43 clears member 12, air entering hole 43 through inlet 43' vents totally at the top of hole 43. To ensure that the solder contained in the shear hole 43 under pressure of the air does not leave the bore 43, the member 44 may be attached to the shear 42 to cover but not seal the shear hole 43. When the shear hole 43 is aligned with the chamber 106 of the crucible 50, the nitrogen venting valve 68 is closed causing nitrogen pressure to rise causing the piston 90 to rise to contact a small pin stop 140 projecting from the underside of the extended shear 140. This prevents the crucible 50 from actually contacting the shear hole 43 assuring reliable transfer of the solder slug to the chamber 106 of the crucible 50. The air pressure in the tube 45 is "shut off" (FIG. 8C) and the piece of solder drops by the force of gravity in the chamber 106. A short pulse of air may be introduced into the top of the shear hole 43 by way of tube 46 to release the solder piece should it stick.

Once the slug has been transferred to crucible 50, valve 68 is opened causing nitrogen to vent through port 65' and allowing piston 90 to return to start position. The shear member 42 is then retracted to its extreme left-hand position as viewed in FIG. 3, clearing the path such that the piston 90 can move upwardly without restriction. A sensing device (not shown) may be used to sense that the piston 90 is at the proper position and out of the path of travel of the shear 42 to receive the next slug of solder.

The laser may now begin heating the crucible 50 and again closing valve 58 to cause the piston 90 to raise the crucible to the plated hole 116 of the PWB. The laser power level and timing of the piston ascent is coordinated such that the solder slug is above liquidous temperature when the solder contacts the protruding wire 114. The laser power may be either programmably adjusted to compensate for the heat sinking effect of the joint, or a temperature sensing closed loop control of laser power may be used to achieve optimal conditions. Such conditions would be fast rise in temperature to the maximum tolerable in the crucible, with the laser power being varied in real time to maintain this temperature throughout the application of the solder.

Above a temperature threshold of 750° F., graphite chemically reacts with oxygen in the air. For this reason, nitrogen gas is continually supplied by way of the tube 94 to exclude air from the chamber, and thus inhibit the deleterious effects of oxygen on the hot suscepting surface when illuminated by the laser beam. The regulated nitrogen pressure provides the force for lifting the piston and crucible containing the solder into soldering position when the valve 68 is closed. At another time in the cycle, the piston member 67 is released to permit the pressure to dissipate through the passage 65 and its outlet bore 65', permitting the piston 90 to drop to its lowermost position in the cylinder in preparation for repeating the process.

In commenting on the method of the present invention, the vertical laser beam alignment with the path of travel of the crucible permits the laser beam to be keyed "on" at any point in the soldering sequence, or left "on" at a lower power. If desired, it can begin heating prior to the depositing of the solder slug to reduce cycle time, for example. The susceptor surface area of the crucible being larger than the crucible chamber permits a reduction of beam power density by distributing the energy over a larger area. The fact that the crucible is carried by a free piston assures the proper soldering position for the molten solder regardless of any mechanical deviations in the vertical position of the PWB board.

In connection with the configuration of the chamber 106 in the crucible 50, such area and configuration relative to the volume of solder that is utilized for each joint, results in a joint with the proper fillet both on top and below the PWB, without leaving any residue of solder in the chamber 106. It should be pointed out that the described embodiment is what may be termed a non-solder-wetting crucible that has the advantage of a relatively simple design and fabrication, as well as being unaffected by the solder alloy, flux or process temperature. The use of a non-wetting crucible in contact with the solder renders it important that the solder volume required to form an acceptable joint be predetermined and metered; and dispensed to the joint such that all the supplied solder remains with the joint when the crucible 50 is withdrawn from the proximity of the joint. As previously described, this non-wetted crucible lifts toward the PWB 20 to a position where the solder does not lose contact with chamber 106 as it travels into the plated hole of the PWB; thus preventing a premature termination of feed to the joint. During experimentation, a solder-wetted surface of a nickel plated metallic crucible 50 was utilized where from 50% to 100% excess solder was brought into contact with the joint. With this arrangement, the crucible did not approach the PWB closer than the end of the projecting lead wire. When the crucible was withdrawn from the joint, the solder column existing between the PWB pad and the crucible rapidly necked down and then parted. The joint inherently retained a volume sufficient to be acceptable; however, the excess solder remained with the crucible and required removal prior to the next cycle.

The material from which the crucible is made is important in that it should present a stable and predictable coupling factor for the particular laser wave length utilized. It also should present a relatively high coupling factor for the sake of process efficiency, and to minimize the effects of any reflected laser energy. The desired low friction instant response of the free piston has been achieved by adapting a commercially available pneumatic dash pot to this application. The dash pot is manufactured by Airpot Corporation, Norwalk, CT. It is composed of a pyrex glass cylinder to which has been carefully matched a graphite piston, normally with a small piston rod attached. In our application, the piston rod was removed and the face of the piston bored out to provide a clear path through the piston zone for the laser beam.

With respect to the limitations applied to the beam of laser energy, an initial energy input of one level is desired to rapidly riase the temperature of the crucible solder to a temperature in excess of 500° F. Then energy at another level is applied to maintain the temperature. For certain applications, an increase in the input power may be required to compensate for the thermal sinking effect when the liquid solder is brought into contact with the joint. Control is also required to compensate for the rise in temperature of the joint at a rate of energy transfer as the solder wets to the extremity of the joint on the component side of the PWB. The maximum process temperature is limited by the particular flux that is utilized; and the rate at which the crucible can be brought to working temperature is limited to the maximum beam power density which the suscepting material can survive.

Referring to FIG. 9, a power supply 120 controls current through the laser generator 95. The laser beam power is controlled by a microcomputer 127 in real time through a binary coded decimal output port and D/A converter 123. X-Y positioner 130 controls the positioning of the PWB through a computerized numerical control referred to generally at 131. The solder advance is achieved through a stepping motor and pneumatic valve interface module generally referred to at 132, which is controlled by the microcomputer 127. The individual components of the system are all well known in the art including the manner and method of controlling a laser. Appendix A is a print-out of a program for automatic operation of the present method of the invention according to one embodiment thereof.

The present invention thus provides virgin solder at each joint with the volume of solder and flux accurately metered. The thermal energy can be adjusted for various joints, and to provide minimum process time, with minimum heat bloom to areas surrounding the joint.

Although the invention has been described in connection with one specific embodiment, it is understood that variations and modifications may be made without departing from the scope and spirit of the appended claims.

```
10   !         DIODE
15   !       02/16/83 AM
40   !     LOAD TASKMASTER·
50   !     SEQ   COMMAND
60   !      1      G10
70   !      2      SHIFT T.1
80   !             N1
90   !
100  !    (+Y MOVES TO RIGHT)
110  !    (+X MOVES AWAY)
900  GOTO 2040
1000 DISP "INPUT HOUR,MIN(24 HR
     CLOCK)" @ INPUT T1,T2
1005 DISP "INPUT MONTH,DAY" @ IN
     PUT T4,T5
1010 SETTIME T1*3600+T2*60,T4*10
     00+T5
2040 ! INITLZ IO
2050 RESET 3
2080 CLEAR @ DISP @ DISP @ DISP
     @ DISP @ DISP " ****  LASE
     R SOLDERING ****"
2100 DIM W$[500],L$[24]
2115 INTEGER W(8),A(96),B(96),C(
     96),D(96),D,F,J,L,L1,L2,L3,
     L4,M,N,N1,N7,N8,N9,P1,P2,P3
2116 INTEGER O,Q1,R,S1,S8,S9,U,U
     3,V2,V3,W1,Z7,W0,U1,A,B
2120 S,S1,V2,V3,D,S8=0
2125 B,A=1
2140 X1=6  ! HOME POSITION
2160 Y1=-6 ! HOME POSITION
2180 F,V3=0
```

```
2200 C=2
2205 L9=7 ! PREHEAT POWER
2210 W=8 @ W(1)=7000 @ W(2)=50 @
     W(3)=200 @ W(4)=300
2215 W(5)=150 @ W(6)=1500 @ W(7)
     =400 @ W(8)=200
2220 W1=0
2280 N8=30 ! SET SODR AMNT
2290 L1=10 ! SET POWER1
2300 L2=114 ! SET POWER2
2320 CONTROL 4,6 ; 0 ! CANCEL DE
     LAY
2340 CONTROL 4,8 ; 3 ! ENABLE OU
     TPUT
2360 CONTROL 4,16 ; 0 ! SUPRESS
     EOL
2380 GOSUB 2540
2420 W$[1]=CHR$(W1)
2440 FOR M=2 TO 500
2460 W$[M]=W$[1]
2480 NEXT M
2500 GOTO 6140
2540 ! CONFIG CONTL WRD
2560 IF S=1 THEN RETURN
2580 CONTROL 4,5 ; 3 ! PORTS B&D
2600 CONTROL 4,4 ; 192 ! NO HAND
     SHAKE
2620 S=1
2640 RETURN
2680 ! CONFG STEPPER
2700 IF S=0 THEN RETURN
2720 CONTROL 4,5 ; 2
2740 CONTROL 4,4 ; 128
2760 S=0
2780 RETURN
2820 ! SOLDER AMOUNT
2840 S8=1 @ GOSUB 5860
2860 DISP "CURRENT NUMBER OF PUL
     SES IS";N8;"."
2880 DISP
2900 DISP "ENTER NUMBER OF STEPP
     ER MOTOR"
2920 DISP "PULSES DESIRED.(MAX 9
     8)"
2940 INPUT N9
2960 IF N9>0 AND N9<400 AND FP(N
     9)=0 THEN N8=N9 @ GOTO 7040
2980 DISP "INPUT IS NOT ACCEPTAB
     LE" @ BEEP @ WAIT 2000 @ GO
     TO 2840
3000 CLEAR @ DISP "WHICH POWER D
     O YOU WISH " @ DISP "TO CHA
     NGE(1 OR 2)" @ INPUT I
3001 IF I=1 THEN 3008
3002 IF I=2 THEN 3010
3003 GOTO 3000
3008 ! POWER1
3009 L4=1 @ GOTO 3026
3010 ! POWER2
3015 L4=0
3026 S8=1 @ GOSUB 5860
3027 IF L4 THEN L3=L1 @ DISP "#1
     ";ELSE L3=L2 @ DISP "#2 ";
3028 DISP "LAZER POWER WAS";L3;"
     WATTS."
3029 DISP
3031 DISP "ENTER DESIRED POWER."
3033 DISP " (MAX=50)"
3035 INPUT L3
3037 IF L3<1 OR L3>50 OR FP(L3)#
     0 THEN 3050
3040 IF L4 THEN L1=L3 ELSE L2=L3
3042 GOTO 7040
3050 DISP "INPUT NOT ACCEPTABLE"
```

```
        @ BEEP @ WAIT 2000 @ GOTO
        3027
3060 ! CYCLE
3070 RESET 3 ! OFF LAZ
3080 S8=1
3100 GOSUB 5840
3120 DISP "           CYCLE"
3180 GOSUB 8000
3200 S8=0
3220 BEEP
3240 GOTO 7040
3580 ! CHK SW STATUS
3590 Z7=0
3600 GOSUB 2540 ! CONFIG IO
3620 ENTER 4 USING "#,W" ; W0 !
     ENTER SWITCH STATUS
3621 IF A AND BIT(W0,B) THEN RET
     URN
3622 IF NOT A AND NOT BIT(W0,B)
     THEN RETURN
3623 Z7=Z7+1 @ IF Z7<550 THEN 36
     20
3624 CLEAR
3625 DISP "PISTON DID NOT RETR"
3626 RESET 3 ! OFF LAZ
3630 FOR M=1 TO 10
3632 BEEP @ WAIT 200
3634 NEXT M
3636 END
3640 RETURN
3680 ! MOVE TABLE
3700 GOSUB 3580
3740 IF FP(X)#0 OR FP(Y)#0 THEN
     3800
3760 OUTPUT 10 USING "#,K" ; CHR
     $(13);"/X";VAL$(X);"/Y";VA
     L$(Y);" ";CHR$(10);"A"
3780 GOTO 3940
3800 IF FP(Y)#0 THEN 3860
3820 OUTPUT 10 USING "#,K" ; CHR
     $(13);"/X";VAL$(X);"/Y";VAL
     $(Y);" ";CHR$(10);"A"
3840 GOTO 3940
3860 IF FP(X)#0 THEN 3920
3880 OUTPUT 10 USING "#,K" ; CHR
     $(13);"/X";VAL$(X);"/Y";VA
     L$(Y);CHR$(10);"A"
3900 GOTO 3940
3920 OUTPUT 10 USING "#,K" ; CHR
     $(13);"/X";VAL$(X);"/Y";VAL
     $(Y);CHR$(10);"A"
3940 STATUS 10,3 ; S3
3960 IF S3>7 THEN 3940
3980 STATUS 10,3 ; S3
4000 IF S3<8 THEN 3980
4020 RETURN
4060 ! OUTPUT TO TABLE
4080 OUTPUT 10 USING "#,K" ; CHR
     $(13);C$;CHR$(10);"A"
4100 STATUS 10,3 ; S3
4120 IF S3>7 THEN 4100
4140 STATUS 10,3 ; S3
4160 IF S3<8 THEN 4140
4180 RETURN
4220 ! CALIBRATE TABLE
4230 RESET 3 ! OFF LAZ
4240 S8=1 @ GOSUB 5840 ! KEY OFF
4260 GOSUB 3580 ! CHK SW
4340 DISP "        CALIBRATE" @ DI
     SP @ DISP
4360 RESET 10
4380 CONTROL 10,2 ; 2,11,30
4400 CONTROL 10,16 ; 0
```

```
4420 STATUS 10,3 ; S3
4440 IF S3>7 THEN 4520
4460 DISP "TASKMASTER NOT READY"
4480 BEEP
4500 STOP
4520 DISP "TABLE MUST BE POSITIO
     NED"
4540 DISP " TO U1-1. PRESS CONT
      IF"
4560 DISP "TABLE IS POSITIONED C
     ORRECTLY"
4580 PAUSE
4600 C$="F100"
4620 GOSUB 4060
4640 C$="G92"
4660 GOSUB 4060
4680 C$="G93"
4700 GOSUB 4060
4720 X=X1 @ Y=Y1
4740 GOSUB 3680
4760 GOTO 7040
4960 ! RAISE/LOWER
4980 IF S1#1 THEN S1=1 @ GOSUB 5
     260
5000 N1=ABS(N)
5020 GOSUB 2680
5040 CONTROL 4,6 ; 128+P
5060 OUTPUT 4 USING "K" ; W$[1,N
     1]
5080 RETURN
5260 ! OUTPUT CONTROL
5300 GOSUB 2540
5320 CONTROL 4,4 ; 192
5380 IF D=1 THEN C=BINAND(C,251)
      ELSE C=BINIOR(C,4)
5400 IF V2=1 THEN C=BINAND(C,239
     ) ELSE C=BINIOR(C,16)
5410 IF V3=1 THEN C=BINAND(C,247
     ) ELSE C=BINIOR(C,8)
5420 IF S1#1 THEN C=BINAND(C,223
     ) ELSE C=BINIOR(C,32)
5440 OUTPUT 4 USING "B" ; C ! OU
     TPUT CONTROL WORD
5460 RETURN
5500 ! MOVE TO NEW IC
5520 U1=U @ R=1
5540 IF U1>8 THEN R=R+1 @ U1=U1-
     8 @ GOTO 5540
5560 IF S2=.3 THEN Y=-A(U)*.001
     ELSE Y=-B(U)*.001
5580 Y=Y-(P1-1)*.1
5600 X=-(R-1)*.45
5620 GOSUB 3680
5640 RETURN
5680 ! SKIP IC'S
5700 S9=0
5720 IF S2=.45 THEN 5780
5740 IF U=44 OR U=90 THEN S9=1
5760 GOTO 5800
5780 IF U=36 OR U=82 THEN S9=1
5800 RETURN
5840 ! RUNNING KEYS
5860 CLEAR
5880 OFF KEY# 1 @ OFF KEY# 2
5900 OFF KEY# 3 @ OFF KEY# 4
5920 OFF KEY# 5 @ OFF KEY# 6
5940 OFF KEY# 7 @ OFF KEY# 8
5960 IF S8 THEN 6000
5980 ON KEY# 1,"END" GOSUB 6040
6000 RETURN
6040 ! END
6080 Q=0
6100 RETURN
```

```
6101 ! FIRE LAZER
6106 IF L<10 THEN L$[1]="+0" @ L
     $[2]=VAL$(L) ELSE L$[1]="+"
     @ L$[2]=VAL$(L)
6110 RESET 3
6111 CONTROL 3,2 ; 128,2,0,0
6112 OUTPUT 3 ;L$
6114 RETURN
6140 ! START XY PROGRAM
6160 REM DATA:STARTING X(.3 SPAC
     ING),STARTING X(.45 SPACING
     ), PINS(.3 SPACING), PINS(.
     45 SPACING)
6180 ! ROW 1
6200 DATA 0,0,8,8,1000,1000,8,8,
     1900,1900,8,8,2900,2900,8,8
6220 DATA 3800,3800,8,8,4800,480
     0,8,8,5700,5700,7,7,6700,67
     00,8,8
6240 ! ROW 2
6260 DATA 0,0,8,8,1000,1000,8,8,
     1900,1900,8,8,2900,2900,8,8
6280 DATA 3800,3800,8,8,4800,480
     0,8,8,5700,5700,7,7,6700,67
     00,8,7
6300 ! ROW 3
6320 DATA 0,0,8,8,1000,1000,8,8,
     1900,1900,8,8,2900,2900,8,8
6340 DATA 3800,3800,8,8,4800,480
     0,7,7,5700,5700,8,8,6700,67
     00,7,7
6360 ! ROW 4
6380 DATA 0,0,8,8,1000,1000,8,8,
     1900,1900,8,8,2900,2900,8,8
6400 DATA 3800,3800,8,8,4800,480
     0,7,7,5700,5700,8,8,6700,67
     00,7,8
6420 ! ROW 5
6440 DATA 0,0,8,8,1000,1000,8,8,
     1900,1900,8,8,2900,2900,8,0
6460 DATA 3800,3800,8,8,4800,480
     0,8,8,5700,5700,7,7,6700,67
     00,7,7
6480 ! ROW 6
6500 DATA 0,0,8,8,1000,1000,8,8,
     1900,1900,8,8,2900,2900,0,0
6520 DATA 3800,3800,7,7,4800,480
     0,8,8,5700,5700,7,7,6700,67
     00,8,7
6540 ! ROW 7
6560 DATA 0,0,8,8,1000,1000,8,8,
     1900,1900,8,8,2900,2900,8,8
6580 DATA 3800,3800,8,7,4800,480
     0,8,8,5700,5700,8,8,6700,67
     00,8,8
6600 ! ROW 8
6620 DATA 0,0,7,8,1000,1000,8,8,
     1900,1900,8,8,2900,2900,7,8
6640 DATA 3800,3800,7,7,4800,480
     0,8,8,5700,5700,8,8,6700,67
     00,8,8
6660 ! ROW 9
6680 DATA 0,0,8,8,1000,1000,8,8,
     1900,1900,8,7,2900,2900,8,7
6700 DATA 3800,3800,8,8,4800,480
     0,7,7,5700,5700,8,7,6700,67
     00,8,8
6720 ! ROW 10
6740 DATA 0,0,8,8,1000,1100,8,7,
     1900,1900,7,7,2900,2900,7,7
```

```
6760 DATA 3800,3800,8,8,4800,480
     0,7,7,5700,5700,7,7,6700,67
     00,8,8
6780 ! ROW 11
6800 DATA 0,0,7,7,1100,1100,8,0,
     2000,2000,8,8,2900,2900,7,7
6820 DATA 3800,3800,8,8,4800,480
     0,8,7,5700,5700,8,8,6700,67
     00,8,8
6840 ! ROW 12
6860 DATA 0,100,8,7,1100,1100,0,
     0,2000,2000,8,8,2900,2900,7
     ,7
6880 DATA 3800,3900,8,8,4800,480
     0,7,7,5700,5700,8,8,6700,67
     00,8,7
6900 FOR U3=1 TO 96
6920 READ A(U3),B(U3),C(U3),D(U3
     )
6940 NEXT U3
7020 Q1=0
7040 ON KEY# 1,"AUTO" GOTO 7240
7060 ON KEY# 2,"RESUME" GOTO 926
     0
7070 ON KEY# 3,"CYCLE" GOTO 3060
7080 ON KEY# 4,"CAL" GOTO 4220
7090 ON KEY# 5,"AMOUNT" GOTO 282
     0
7190 ON KEY# 6,"POWER" GOTO 3000
7160 ON KEY# 7,"WAITS" GOTO 9480
7180 ON KEY# 8,"DOCMNT" GOTO 950
     0
7200 CLEAR @ DISP "AMOUNT=";N8 @
      DISP "POWER1=";L1 @ DISP "
     POWER2=";L2
7210 FOR I=1 TO W
7211 DISP "WAIT";I;"=";W(I)
7212 NEXT I
7215 KEY LABEL
7220 GOTO 7220
7240 ! START AUTO
7245 S8=0
7250 GOSUB 3580 ! CHK SW
7260 RESET 3 ! OFF LAZ
7270 CLEAR @ GOSUB 5840
7360 C$="G91"
7390 GOSUB 4060
7400 X,Y=.005
7420 GOSUB 3680
7440 C$="G90"
7460 GOSUB 4060
7480 X=X1
7500 Y=Y1
7520 GOSUB 3680
7540 CLEAR @ DISP "ENTER SPACING
      (.3 OR .45)" @ INPUT S2
7560 IF S2#.3 AND S2#.45 THEN 77
     20
7580 DISP "ENTER STARTING U#" @
     INPUT U
7600 IF U>96 OR FP(U)#0 THEN 772
     0
7620 GOSUB 5680
7640 IF S9=1 THEN 7720
7660 DISP "ENTER STARTING PIN" @
      INPUT P1
7680 IF FP(P1)#0 THEN 7720
7700 IF S2=.3 AND P1>C(U) OR S2=
     .45 AND P1>D(U) THEN 7720 E
     LSE 7740
```

```
7720 DISP "INPUT NOT ACCEPTABLE"
     @ BEEP @ WAIT 2000 @ GOTO
     7540
7740 DISP "ENTER QTY. OF JOINT P
     AIRS" @ INPUT Q
7760 IF FP(Q)#0 OR Q<1 THEN 7720
7762 GOSUB 5500
7764 L=L9 @ GOSUB 6101 ! PREHEAT
7766 WAIT W(1)
7768 RESET 3 ! LASER OFF
7770 GOSUB 9700 ! DELIVER SLUG
7840 IF S2=.3 THEN P2=C(U) ELSE
     P2=D(U)
7860 P3=P1
7880 FOR J=1 TO 2
7900 CLEAR @ DISP "U";U;"-";P3;
7920 IF J=1 THEN DISP "A";ELSE D
     ISP "B";
7940 DISP "        ";Q;"TO GO"
7960 KEY LABEL
7980 GOTO 8050
8000 ! START SOLDER SEQUENCE
8002 L=L9 @ GOSUB 6101 ! PREHEAT
8004 WAIT W(1)
8006 RESET 3 ! LASER OFF
8025 GOSUB 9700 ! DELIVER SOLDER
8050 L=L1 @ GOSUB 6101 ! POWER1
8051 Q1=1
8052 N7=INT(N8/2)
8055 WAIT W(4)
8060 V3=1 @ GOSUB 5260 ! PISTON
          ADVANCE
8065 P=15 @ N=N7+RMD(N8,2) @ GOS
     UB 4960 ! FEED SOLDER
8070 WAIT W(5)
8080 L=L2 @ GOSUB 6101 ! POWER2
     ON
8085 P=15 @ N=N7 @ GOSUB 4960 !
          FEED SOLDER
8090 WAIT W(6)
8100 RESET 3 ! LASER OFF
8110 WAIT W(7)
8115 BEEP
8120 V3=0 @ GOSUB 5260 ! PISTON
          RETRACT
8130 GOSUB 3580 ! CHK PISTON
8740 IF S8 THEN RETURN
8760 IF S2=.3 THEN 8782
8780 IF J=1 THEN X=X-(S2+.02) EL
     SE X=X+(S2+.02)
8781 GOTO 8785
8782 IF J=1 THEN X=X-(S2+.02) EL
     SE X=X+(S2+.02)
8785 IF P3>P2 THEN 8820
8800 IF J=1 THEN GOSUB 9700 @ GO
     TO 8814
8802 IF Q>1 AND P3<P2 THEN GOSUB
      9700 @ GOTO 8814
8804 IF Q<=1 THEN WAIT W(8) @ GO
     TO 8814
8806 IF S2=.3 AND U=96 OR S2=.45
      AND U=88 THEN WAIT W(8) @
     GOTO 8814
8808 GOSUB 9700 ! DELIVER SLUG
8814 GOSUB 3680 ! MOVE
8820 NEXT J
8840 Q=Q-1
8860 IF Q>0 THEN 8940
8880 GOSUB 9600
```

```
8900 X=X1 @ Y=Y1 @ GOSUB 3680
8920 GOTO 7040
8940 IF P3<P2 THEN Y=Y-.1 @ GOSU
     B 3680
8960 P3=P3+1
8980 IF P3<=P2 THEN 7830
9000 ! MOVE TO NEXT IC
9020 IF S2=.3 THEN U=U+1 @ GOTO
     9060
9040 IF U=R*8 THEN U=U+9 ELSE U=
     U+1
9060 GOSUB 5680
9080 IF S9 THEN U=U+1 @ GOTO 906
     0
9100 IF S2=.3 AND U<=96 THEN 920
     0
9120 IF S2=.45 AND U>88 OR S2=.3
      AND U>96 THEN 9140 ELSE 92
     00
9140 DISP "LAST IC" @ GOSUB 9600
9160 X=X1 @ Y=Y1 @ GOSUB 3680
9180 GOTO 7040
9200 P1=1
9210 GOSUB 5500
9220 GOTO 7840
9260 ! RESUME
9270 RESET 3 ! OFF LAZ
9280 S8=0
9285 GOSUB 5840 ! KEY OFF
9290 GOSUB 3580 ! CHK SW
9380 IF Q1=0 THEN DISP "CAN NOT
     CONTINUE!" @ BEEP @ WAIT 20
     00 @ GOTO 7040
9400 DISP "ENTER QTY. OFJOINT PA
     IRS" @ BEEP @ INPUT Q
9420 CLEAR @ KEY LABEL
9440 P1=P3 @ GOSUB 5500
9442 L=L9 @ GOSUB 6101 ! PREHEAT
9443 WAIT W(1)
9444 RESET 3 ! LASER OFF
9446 GOSUB 9700 ! DELIVER SLUG
9460 GOTO 8940
9480 CLEAR @ DISP "WHICH WAIT DO
      YOU WISH TO CHANGE"
9482 INPUT I
9483 DISP "CURRENT WAIT IS:";W(I
     )
9484 DISP "INPUT # OF MILLISECON
     DS" @ INPUT W(I)
9488 GOTO 7040
9500 T=TIME @ T1=INT(T/3600) @ T
     2=INT((T-T1*3600)/60) @ T3=
     INT(T-T1*3600-T2*60)
9508 T=DATE @ T4=INT(T/1000) @ T
     5=T-T4*1000
9514 PRINT @ PRINT @ PRINT "DATE
     :";T4;"/";T5
9516 PRINT "TIME: ";T1;":";T2;":
     ";T3 @ PRINT
9518 PRINT "AMOUNT =";N8
9520 PRINT "POWER1 =";L1
9522 PRINT "POWER2 =";L2
9524 FOR I=1 TO W
9526 PRINT "WAIT #";I;"=";W(I)
9528 NEXT I
9530 GOTO 7040
9600 BEEP 201,200 @ BEEP 94,200
     @ BEEP 201,200
9602 RETURN
```

```
9700 REM DELIVER SOLDER
9705 GOSUB 3580  ! CHK PISTON
9710 D=1 @ GOSUB 5260 ! JET ON
9715 V2=1 @ GOSUB 5260 ! SHEAR
9720 B=2 @ GOSUB 3580 @ B=1
9722 V3=1 @ GOSUB 5260 ! PIST UP
9723 A=0 @ GOSUB 3580 @ A=1 ! WA
     IT TIL UP
9724 WAIT W(2)
9725 D=0 @ GOSUB 5260 ! JET OFF
9730 WAIT W(3)
9732 V3=0 @ GOSUB 5260 ! PIST DW
     N
9733 GOSUB 3580 ! WAIT TIL DOWN
9735 V2=0 @ GOSUB 5260 ! RETRACT
     SHEAR
9740 RETURN
9999 END
```

(The following page is claim page 18)

What we claim is:

1. An apparatus for soldering conductive leads of electronic components in plated holes of a printed wiring board, comprising
    a supporting member having a vertically extending cylindrical bore formed therein,
    first means to hold a printed wiring board spaced from and above the supporting structure in a position such that the axis of the plated holes are substantially parallel with the axis of the vertical bore,
    a crucible assembly having a chamber for holding a quantity of solder slidably mounted in the vertical bore,
    second means in communication with the crucible assembly in the bore to apply force sufficient to lift the crucible upwardly in the bore to soldering position beneath a printed wiring board,
    third means to apply a beam of energy along the axis of the cylindrical bore to melt solder in the crucible chamber at times when the crucible assembly is in a selected position,
    fourth means to release the applied lifting force to cause the crucible assembly to slide downwardly in the bore to a predetermined position subsequent to each application of molten solder,
    fifth means to deposit a solid piece of solder in the crucible chamber at times when the crucible is in a predetermined position; and
    sixth means to change the relative position of the supporting member and a board held by the first means at times when the crucible is in a predetermined position to place a different plated hole of the board in registry with the crucible chamber.

2. An apparatus according to claim 1 wherein the third means comprises a second bore in the supporting member that is oriented to communicate at one end with the vertical bore and at its other end with a source of energy for melting the solder, a deflector mounted at the juncture of the vertical and second bores to direct the energy axially through the vertical bore and the central opening of the sleeve and the hollow piston to the susceptor surface of the crucible.

3. An apparatus according to claim 1 wherein the crucible assembly comprises a hollow piston to which a crucible member having an integral susceptor surface is connected, said crucible susceptor surface and hollow piston forming an inverted chamber through which the energy beam is directed, said susceptor surface being of greater cross sectional area than the crucible chamber for holding the solder.

4. An apparatus according to claim 3 wherein the hollow piston includes a lower skirt portion of graphitic material and a thermal insulative member interposed between the crucible and the skirt portion for minimizing the transfer of heat between the crucible and the skirt portion.

5. An apparatus according to claim 3 wherein said second means comprises a sleeve fixed in the vertical bore, said sleeve having an upper radial surface which supports the hollow piston at its lowermost position, said sleeve having a central opening therethrough which the energy beam is directed and a bore radially offset above and from the central opening in communication with the radial surface, and means connected to the bore at its other end for supplying fluid under pressure to the crucible assembly.

6. An apparatus according to claim 1 wherein the fourth means comprises a valve operative when open to release fluid pressure from beneath the crucible assembly and operative when closed to seal the vertical bore of the supporting member, and a passage from the interior of the crucible assembly to its outer surface to release pressure from beneath the crucible assembly at times when the crucible exceeds a predetermined upper position.

7. An apparatus according to claim 3 wherein the crucible member has internally tapering chambers, and is made of graphitic material.

8. An apparatus according to claim 4 wherein the thermal insulative member has a frustroconical configuration that is threaded at its narrow upper portion, and the crucible member is threaded to mate with the threaded portion of the insulative member.

9. An apparatus according to claim 1 wherein the fifth means comprises a stationary shearing member having a bore therein for receiving a length of solder, a shearing member slidably mounted on the stationary member having a bore therein into which a length of solder extends at times when the shearing members are in a retracted position, said slidable member being operative in cooperation with the stationary member to cut a piece of solder extending into its bore at times when the shearing member slides from its retracted position, and means for applying fluid pressure against the cut piece of solder to hold the solder against the wall of the bore while the shear is carrying the solder to be in registry with the crucible assembly, and means to force the cut piece of solder out of the bore upon release of the fluid pressure.

10. Apparatus according to claim 5 wherein the means for supplying fluid under pressure comprises means to supply nitrogen gas.

11. An apparatus for soldering conductive leads of electronic components in plated holes of a printed wiring board, comprising a supporting member having a vertically extending cylindrical bore formed therein, first means to hold a printed wiring board spaced from and above the supporting structure in a position such that the axis of the plated holes are substantially parallel with the axis of the vertical bore, a crucible assembly having a chamber and including a susceptor surface for holding a quantity of solder slidably mounted in the vertical bore, second means in communication with the crucible assembly in the bore to apply force sufficient to lift the crucible upwardly in the bore to soldering position beneath a printed wiring board, third means including a second bore in the supporting member that is oriented to communicate at one end with the vertical bore and at its other end with a source of energy for melting the solder, a deflector mounted at the juncture of the first and second bores to direct the energy axially through the vertical bore and the central opening of the sleeve and the hollow piston to the susceptor surface of the crucible to apply a beam of energy along the axis of the cylindrical bore to melt solder in the crucible chamber at times when the crucible assembly is in a selected position, fourth means including a valve operative when open to release fluid pressure from beneath the crucible assembly and operative when closed to seal the vertical bore of the supporting member, and a passage from the interior of the crucible assembly to its outer surface to release pressure from beneath the crucible assembly at times when the valve is closed and the crucible exceeds a predetermined upper position to cause the crucible assembly to slide downwardly in the bore to a predetermined position subsequent to each application of molten solder, fifth means including a stationary shearing member having a bore therein for receiving a length of solder, a sliding shearing member slidably mounted on the stationary member having a bore therein into which a length of solder extends at times when the shearing members are in a retracted position, said slidable member being operative in cooperation with the stationary member to cut a piece of solder extending into its bore at times when the shearing member slides from its retracted position, and means for applying fluid pressure against the cut piece of solder to hold the solder against the wall of the bore while the shear is carrying the solder to be in registry with the crucible assembly, and means to force the cut piece of solder out of the bore upon release of the fluid pressure to deposit a solid piece of solder in the crucible chamber at times when the crucible is in a predetermined position; and sixth means to change the relative position of the supporting member and a board held by the first means at times when the crucible is in a predetermined position to place a different plated hole of the board in registry with the crucible chamber.

12. In a system for applying molten solder to a plated hole from the underside of a printed wiring board, the improvement of a solder applying assembly, comprising a vertically oriented cylinder, a cylindrical crucible assembly having a solder carrying chamber and a susceptor surface, said crucible assembly being mounted slidably in the cylinder, means to apply fluid under pressure to prepare the crucible assembly upwardly in the vertical cylinder, means to melt solder in the crucible chamber, and means to hold a printed wiring board in horizontal position above the crucible assembly such that the crucible chamber registers with a plated hole for applying the solder.

13. In a system according to claim 12 wherein the improvement of the solder applying assembly further comprises, means to direct an energy beam through the vertical cylinder to the susceptor surface for melting solder in the crucible chamber.

14. In a system according to claim 12 wherein the crucible assembly of the improvement of the solder applying assembly comprises a susceptor surface having a cross-sectional area larger than the crucible, said crucible including the susceptor surface being constructed of graphitic material.

* * * * *